US006285027B1

(12) United States Patent
Chernushevich et al.

(10) Patent No.: US 6,285,027 B1
(45) Date of Patent: Sep. 4, 2001

(54) MS/MS SCAN METHODS FOR A QUADRUPOLE/TIME OF FLIGHT TANDEM MASS SPECTROMETER

(75) Inventors: Igor Chernushevich, Etobicoke; Bruce Thomson, North York, both of (CA)

(73) Assignee: MDS Inc., Etobicoke (CA)

( * ) Notice: Subject to any disclaimer, the term of this patent is extended or adjusted under 35 U.S.C. 154(b) by 0 days.

(21) Appl. No.: 09/316,388

(22) Filed: May 21, 1999

(30) Foreign Application Priority Data

Dec. 4, 1998 (CA) ..... 2255122

(51) Int. Cl.[7] ..... H01J 49/40
(52) U.S. Cl. ..... 250/287
(58) Field of Search ..... 250/287, 282, 250/286

(56) References Cited

U.S. PATENT DOCUMENTS 5,032,722 * 7/1991 Boesl et al. ..... 250/287
5,689,111 11/1997 Dresch et al. ..... 250/287
5,763,878 6/1998 Franzen ..... 250/292

OTHER PUBLICATIONS

Matthias Wilm, et al, "Parent Ion Scans of Unseparated Peptide Mixtures", Analytic Chemistry, vol. 68, No. 3, Feb. 1, 1996.

Whitehouse, Craig, et al, "A Two Dimensional Ion Trap API TOF Mass Spectrometer", Abstract from the Proceeding of the 46th ASMS Conference on Mass Spectrometry and Associated Topics, Orlando, Florida, May 31–Jun. 4, 1998.

* cited by examiner

*Primary Examiner*—Kiet T. Nguyen
(74) *Attorney, Agent, or Firm*—Bereskin & Parr

(57) ABSTRACT

There is provided a method of effecting mass analysis on an ion stream, the method comprising passing the ion stream through a first mass resolving spectrometer, to select parent ions having a first desired mass-to-charge ratio. The parent ions are then subject to collision-induced dissociation (CID) to generate fragment ions, and the fragment ions and any remaining parent ions are trapped; the CID and trapping can be carried out together in a linear ion trap. Periodically pulses of the trapped ions are released into a time of flight (TOF) instrument to determine the mass-to-charge ratio of the ions. The delay between the release of the pulses and the initiation of the push-pull pulses of the TOF instrument are adjusted to maximize the duty cycle efficiency and hence the sensitivity for a selected ions with a desired mass-to-charge ratio. This technique can be used to optimize the performance for a parent ion scan, and MRM scan or a neutral loss scan.

6 Claims, 8 Drawing Sheets

Tryptic digest of myoglobin

Figure 1:
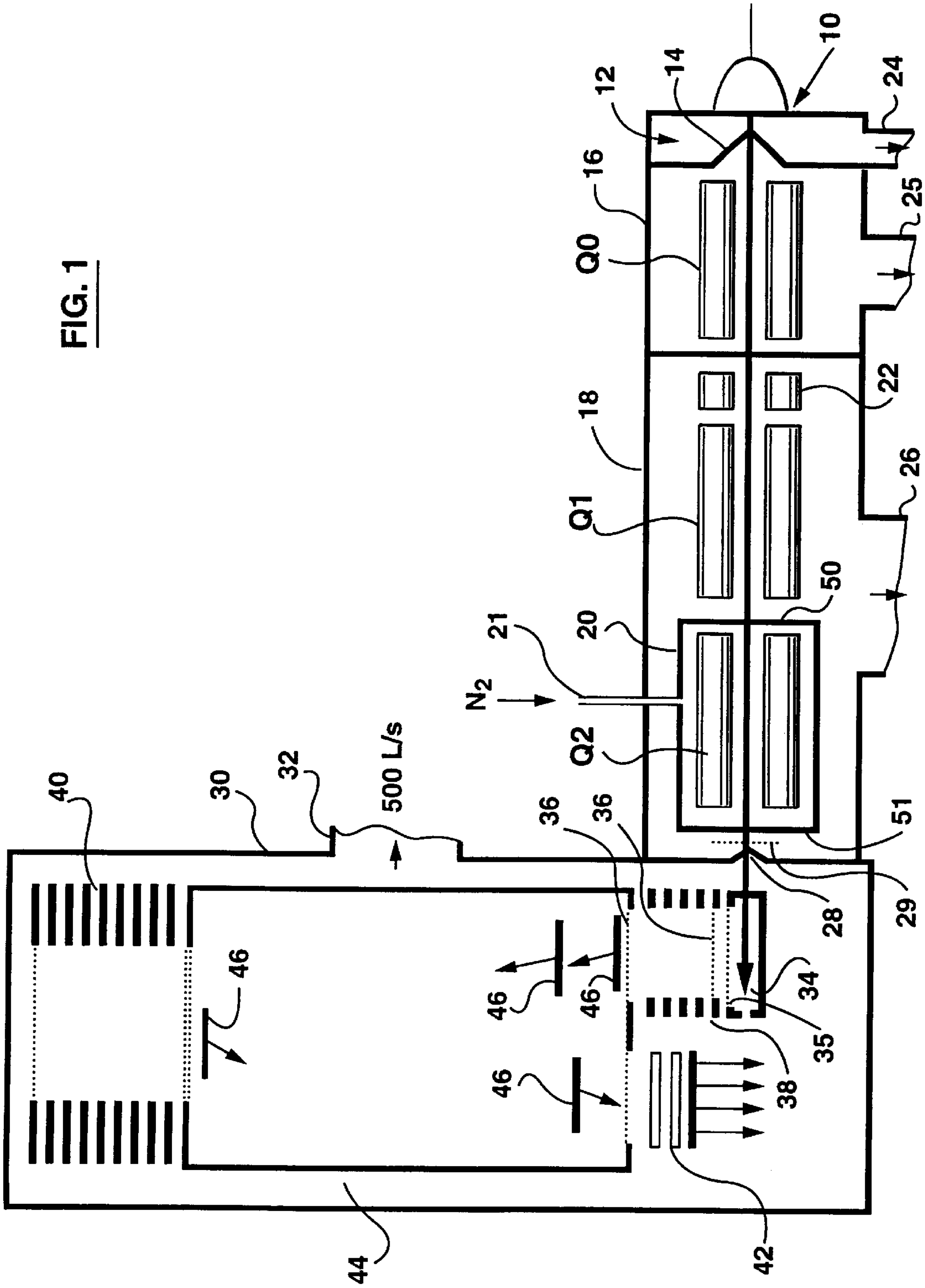

Parent ion scan for m/z = 86; no trapping

Parent ion scan for m/z = 86; with trapping

Trapping studies with TOF in DC-mode
Orifice-skimmer fragmentation; m/z = 86 selected in Q1

MS/MS SCAN METHODS FOR A QUADRUPOLE/TIME OF FLIGHT TANDEM MASS SPECTROMETER

FIELD OF THE INVENTION

This invention relates to mass spectrometry including multiple mass analysis (MS/MS) steps and final analysis in a time of flight (TOF) device. This invention is more particularly concerned with such a technique carried out in a hybrid tandem quadrupole-TOF (QqTOF) spectrometer and is concerned with improving the duty cycle of such an instrument for parent ion scanning and like operations.

BACKGROUND OF THE INVENTION

Tandem mass spectrometry is widely used for trace analysis and for the determination of the structures of ions. In tandem mass spectrometry a first mass analyzer selects ions of one particular mass to charge ratio (or range of mass to charge ratios) from ions supplied by an ion source, the ions are fragmented and a second mass analyzer records the mass spectrum of the fragment ions. In a triple quadrupole mass spectrometer system, this effects MS/MS. Ions produced in an atmospheric pressure source, pass through a region of dry nitrogen and then pass through a small orifice, into a region at a pressure of several torr. The ions then pass through a quadrupole ion guide, operated a pressure of about 7×10−3 torr into a first quadrupole mass analyzer, operated at a pressure of about 2×10−5 torr. Precursor ions mass selected in the first quadrupole mass analyzer are injected into a collision cell filled with an inert gas, such as argon, of a pressure of $10^{-4}$ to $10^{-2}$ torr. The collision cell contains a second quadrupole (or multipole) ion guide, to confine ions to the axis. Ions gain internal energy through collisions with gas and then fragment the fragment ions and any undissociated precursor ions then pass into a third quadrupole, which forms a second mass analyzer, and then to a detector, where the mass spectrum is recorded.

Triple quadrupole systems are widely used for tandem mass spectrometry. One limitation is that recording a fragment mass spectrum can be time consuming because the second mass analyzer must step through many masses to record a complete spectrum. As in any scanning mass analyzer, all other ions (outside of 'transmission window') are lost for analysis, thus reducing the duty cycle to values of around 0.1% or less. To overcome these limitations, QqTOF systems have been developed (as described for example in: Morris, H. R.; Pacton, T; Dell, A.; Langhorne, J.; Berg. M.; Bordoli, R. S.; Hoyes, J.; Bateman, R. H.; *Rapid Commun. Mass Spectrometry,* 1996, 10, 889–896; and Shevchenko, A.; Chernushevich, I.; Ens, W.; Standing, K. G.; Thomson, B.; Wilm, M.; Mann, M., *Rapid Commun. Mass Spectrometry,* 1997, 11, 1015–1024). This system is similar to the triple quadrupole system but the second mass analyzer is replaced by a time-of-flight mass analyzer, TOF. The advantage of the TOF is that it can record $10^4$ or more complete mass spectra in one second without scanning. Thus for applications where a complete mass spectrum of fragment ions is desired the duty cycle is greatly improved with a TOF mass analyzer and spectra can be acquired more quickly. Alternatively for a given measurement time, spectra can be acquired on a smaller amount of sample.

A further known technique is the coupling of electrospray ionization (ESI) to time-of-flight mass spectrometers (TOFMS), and this is an attractive technique for mass spectrometry. ESI is a soft ionization technique capable of forming ions from a broad range of biomolecules, while TOFMS has the well known advantages of rapid mass scanning, high sensitivity, and a theoretically limitless mass range. However, ESI and TOFMS are, in one way, incompatible as a source/analyzer pair: ESI creates a continuous stream of ions and TOFMS requires pulsed operation. Thus in the simplest coupling of ESI to TOFMS there is a very poor duty cycle, with less than 1% of the ions formed being detected (to obtain reasonable mass resolution) and early work in this field was predominantly concerned with increasing the duty cycle.

Within the past two years, literature on ESI-TOFMS has begun to focus on tandem mass spectrometry (MS/MS) with hybrid instruments. The fragmentation of ions in these systems is achieved via traditional methods for collision induced dissociation (CID). Tandem-in-space systems termed quadrupole-TOF's (QqTOF or QTOF), as noted above, are analogous to triple quadrupole mass spectrometers—the precursor ion is selected in a quadrupole mass filter, dissociated in a radiofrequency- (RF-) only multipole collision cell, and the resultant fragments are analyzed in a TOFMS. Tandem-in-time systems use a 3-D ion trap mass spectrometer (ITMS) for selecting and fragmenting the precursor ion, but pulse the fragment ions out of the trap and into a TOFMS for mass analysis.

Tandem mass spectrometers (in particular, triple quadrupoles and QqTOFs) are often used to perform a technique known as a parent ion scan (or precursor ion scan). In this technique, the first mass resolving quadrupole is scanned in order to sequentially transmit parent ions over a selected mass range. The second mass spectrometer is used to selectively transmit only one specific fragment or product ion from the collision cell. The mass spectrum thus produced by scanning the first mass spectrometer shows only those ions from the ion source which fragment to produce the specific product ion. Thus from a complex mixture of ionized species, a simple mass spectrum showing only those components which produce the known fragment ion is produced. This method is often used in order to identify parent ions as candidates for full MS/MS. For example, if the sample contains a mixture of many different species, and the only compounds of interest are those which have a structure known to always generate a fragment of m/z 86, then a parent ion scan may be performed in order to identify which parent ions form m/z 86. A full MS/MS spectrum may then be performed on those few parent ions, instead of on every peak in the Q1 mass spectrum. In this way, a significant amount of time can be saved in analyzing the sample.

In triple quadrupoles, parent ion scans have proved to be the right tool to search for ions of certain classes of compounds, e.g. peptides[1], glycopeptides[2] or phosphopeptides[3] (as detailed, for example in the following references for these three classes of compounds: [1]M. Wilm, G. Neubauer and M. Mann, *Anal. Chem.,* 1996, 68, pp. 527–533; [2]S. A. Carr, M. J. Huddleston and M. F. Bean, *Protein Science,* 1993, 2, pp. 183–196; [3]S. A. Carr, M. J. Huddleston and R. S. Annan, *Anal. Biochem.,* 1996, 239, pp. 180–192). However, a current limitation of the Qq-TOFs is their lower sensitivity in this particular mode of operation, compared to triple quadrupoles. The last mass analyzer (TOF or Q3) does not need to scan in this mode, and the Qq-TOF does not benefit from simultaneous ion detection in TOF. On the other hand, more ions are lost in a TOF compared to a third quadrupole: at the entrance, on grids, and mostly due to duty cycle.

The problem here is that usually the fragment ions cover a large m/z range, and the TOF instrument has to capture all that m/z range if consecutive spectra are not to overlap. If one is interested in just a particular mass, then this can lead to a low duty cycle.

There are two main factors governing the duty cycle of an orthogonal acceleration TOF instrument when operated in the conventional (continuous beam) mode. Generally, you have to wait for the heaviest ions to reach the detector before the next pulse of ions can be introduced. Since the width of the entrance window is only a fraction of the transverse distance between the ion storage region and the detector, even the heaviest ions will overfill this region before the next pulse of ions can be released. The loss due to this effect is simply equal to the ratio of the length of the entrance window to the distance between the storage region and the detector. This ratio is often 1:4, giving a maximum duty cycle of 25% (achievable only for the heaviest ions).

Additionally, there is a loss factor due to the mass-dependent velocities of the ions. This is due to the fact that ions have a constant transverse energy, which means that the velocities of the lighter ions are higher than those of heavier ions (in the ratio of the square root of the ratio of the masses). This means that the duty cycle loss of lighter ions is larger than that of the heaviest ions in the spectrum, that is the lighter ions tend to overfill the ion storage region to an even greater extent than the heavier ions. For example, if ions of up to m/z 2000 are present, and one is particularly interested only in m/z 200, then the additional loss factor is:

$$\sqrt{\frac{200}{2000}} = \sqrt{0.1} = 0.316$$

Putting together the loss factor for the heaviest ions, plus the additional loss factor for lighter ions, gives for m/z 200 a total duty cycle of approximately 31.6% time 25%, which is approximately equal to 8%.

It has been known to provide ion traps in a TOF mass spectrometer (although not in a QqTOF type of arrangement, using the collision cell as the ion trap). Thus, U.S. Pat. No. 5,689,111 (Dresch et al and assigned to Analytica of Brantford) describes an instrument which provides a linear two-dimensional ion guide with a time of flight mass analyzer. The ion guide is a multipole ion guide. However, while the intention is to improve the duty cycle, a single ion guide is provided extending through two different chambers. An ion entrance section of the ion guide is located in a region where background gas pressure is in the viscous flow regime and the pressure along the ion guide drops to molecular flow pressure regimes at the ion exit section. The ion guide is switched to operate as an ion trap. However, this is not a tandem instrument in that there is only a single multipole ion guide. Thus, this instrument can only detect ions in a certain mass range, and does not have the ability to provide an upstream mass resolving section to select ions of interest. There is no recognition that this method can be applied to enhance the sensitivity of an MS/MS device where ions are coming out of a collision cell. Nor is there any indication that it can be used to enhance sensitivity in any situation where one or more specific ions (fragments or precursors) are desired to be monitored. Specifically, there is no indication that the method can be used to enhance the sensitivity in a parent ion scan mode, MRM mode, or neutral loss scan mode.

Another proposal is found in U.S. Pat. No. 5,763,878. This discloses a method and device for orthogonal injection into a time of flight mass spectrometer. It provides a somewhat unusual arrangement in which the multipole rod set extends through to the time of flight instrument. Ions are then pulsed out from one of the rod sets into the field free drift region of the time of flight instrument. However, again, there is no provision of an upstream mass resolving section. Also, both these patents do not discuss or mention a parent ion scanning technique, and do not mention any MS/MS scanning methods.

SUMMARY OF THE INVENTION

It is now being realized that providing an ion trap in a QqTOF can lead to considerable improvement in the duty cycle of the overall instrument, for those types of scan where a relatively narrow m/z range needs to be recorded by the TOF analyzer, in particular: parent ion scan, "neutral loss" scan, and "multiple reaction monitoring" (MRM) scan, which is sometimes referred to as "selected reaction monitoring" (SRM) scan.

In accordance with the present invention, there is provided a method of effecting mass analysis on an ion stream, the method comprising:

(1) passing the ion stream through a first mass resolving spectrometer, to select parent ions having a first desired mass-to-charge ratio;

(2) subjecting the parent ions to collision-induced dissociation to generate fragment ions;

(3) trapping the fragment ions and any remaining parent ions;

(4) periodically releasing pulses of the trapped ions into a time of flight instrument to detect ions with a second mass-to-charge ratio; and (5) providing a delay between the release of the pulses of trapped ions and initiation of push-pull pulses in the time of flight instrument, and adjusting the delay to improve the duty cycle efficiency of ions with the second mass-to-charge ratio.

In one aspect of the present invention, the method includes in step (1) sequentially scanning over a range of masses, to effect a parent ion scan.

In a further aspect of the present invention, the method includes scanning the first and second mass-to-charge ratios over desired ranges to maintain a substantially constant neutral mass loss between the first and second mass-to-charge ratios, whereby a neutral loss scan is effected, and simultaneously adjusting the delay as the second desired mass-to-charge ratio is scanned over the desired range.

Alternatively, in a third aspect of the present invention, the method includes the following additional steps:

- sequentially setting the first mass resolving spectrometer to select non-contiguous parent ions with selected parent mass-to charge ratios;
- for each selected parent mass-to charge ratio, adjusting the delay for detection of a corresponding fragment ion;
- whereby the TOF spectra indicate the presence of each fragment ion generated from the corresponding parent ion, to effect a multiple reaction monitoring (MRM) scan.

BRIEF DESCRIPTION OF THE DRAWING FIGURES

Figure 2A:
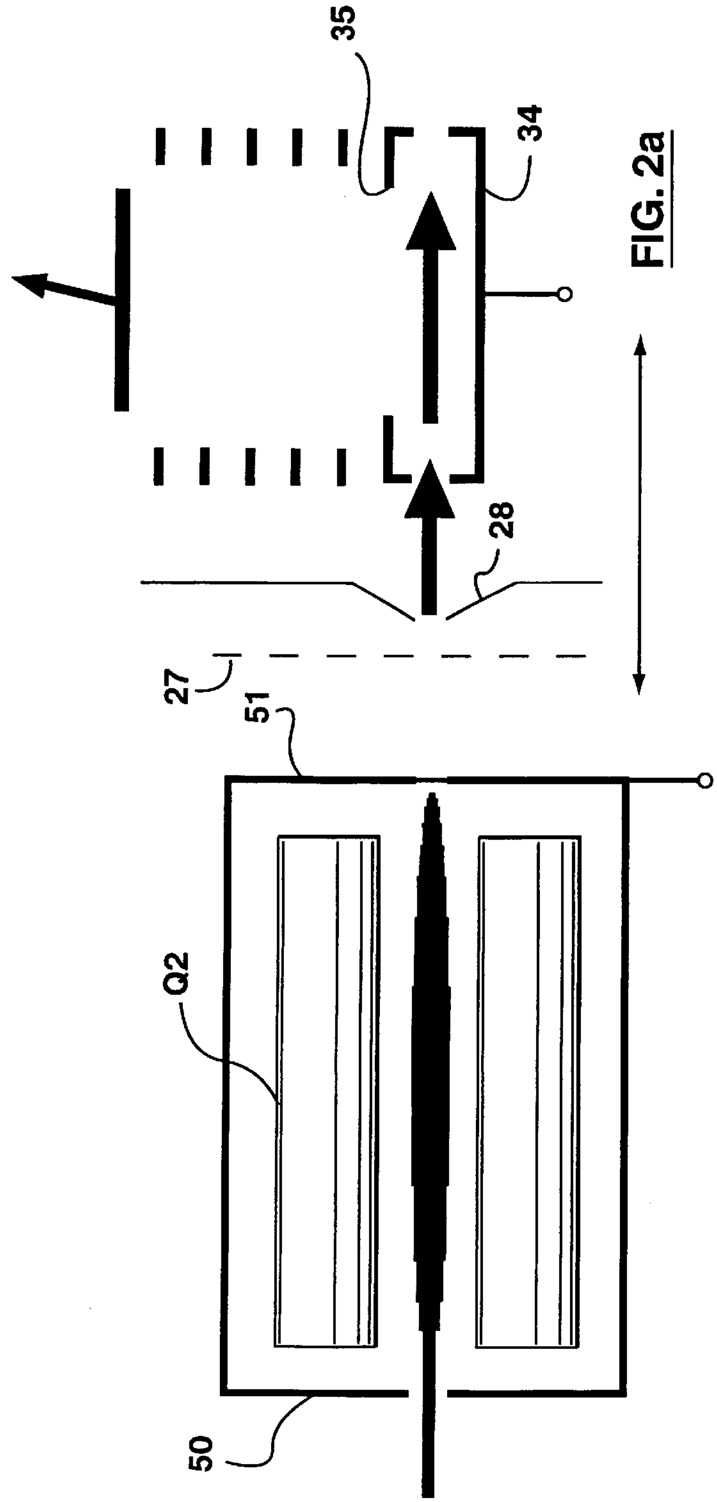
Figure 2B:
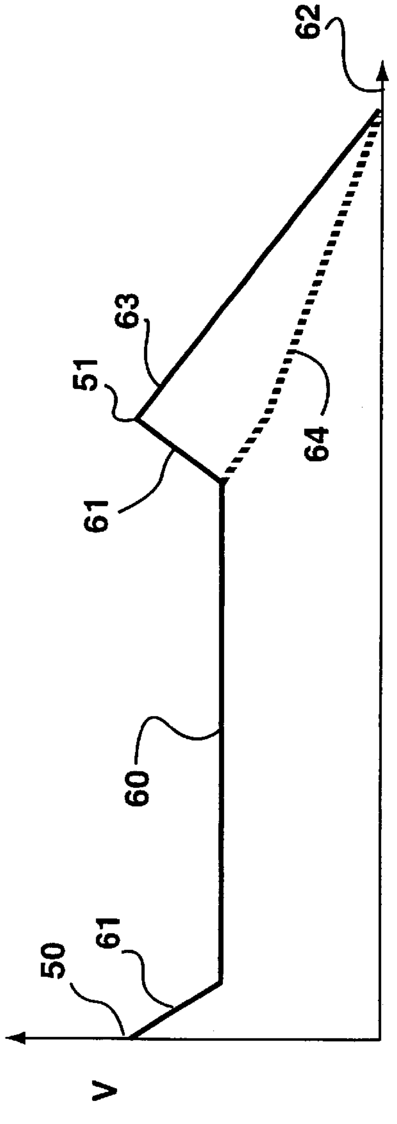
Figure 2C:
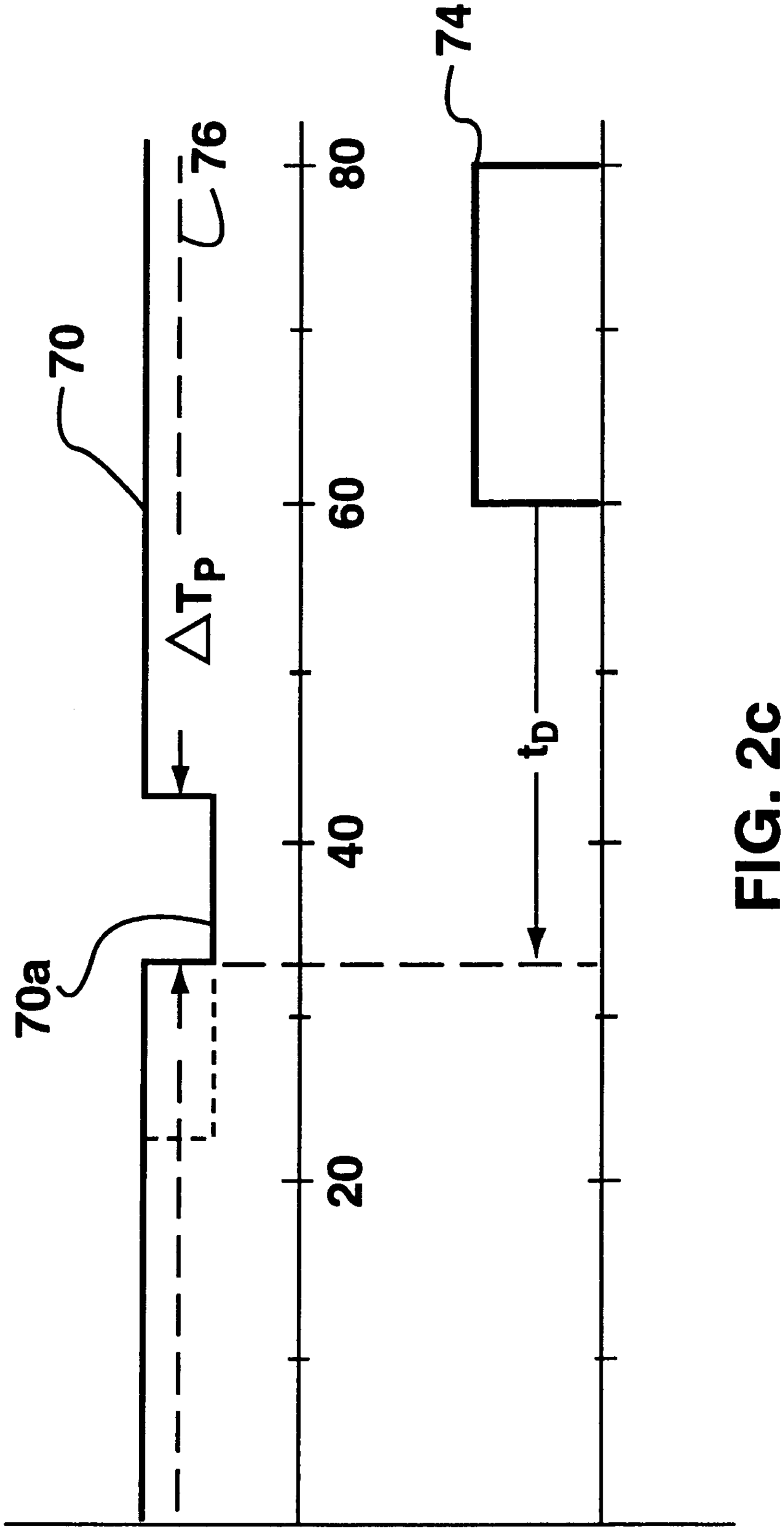

For a better understanding of the present invention and to show more clearly how it may be carried into effect, reference will now be made, by way of example, to the accompanying drawings which show a preferred embodiment of the present invention and in which:

FIG. 1 is a schematic of a QqTOF instrument;

FIG. 2*a* is a detailed schematic of the collision cell and pulser section at the TOF at FIG. 1;

FIG. 2*b* is a diagram showing variation of the DC potential in the collision cell;

FIG. 2*c* is a timing diagram for pulses for the QqTOF of FIG. 2*a;*

Figure 4A:
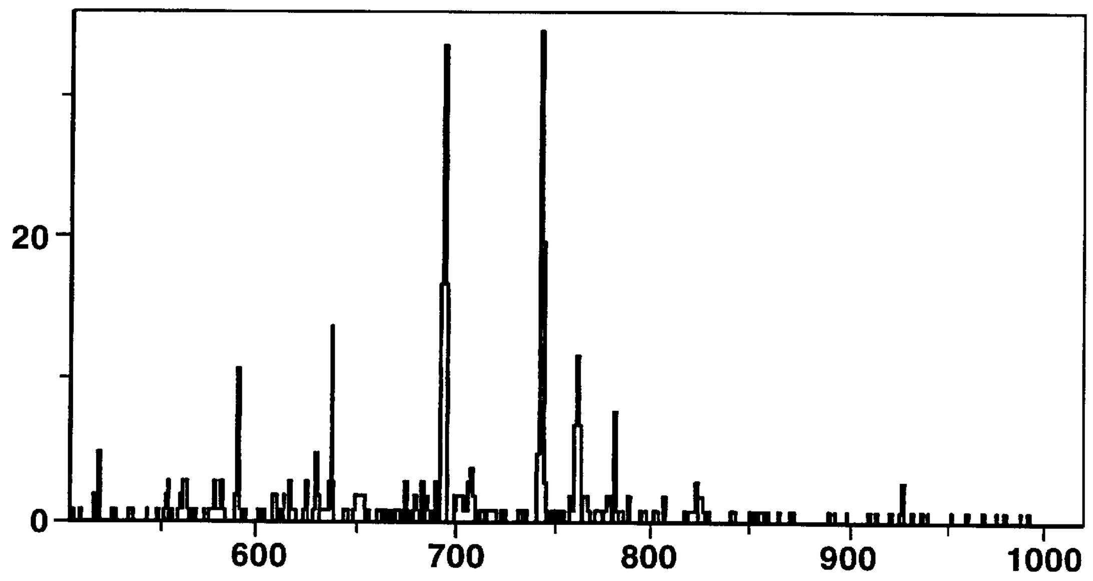
Figure 4B:
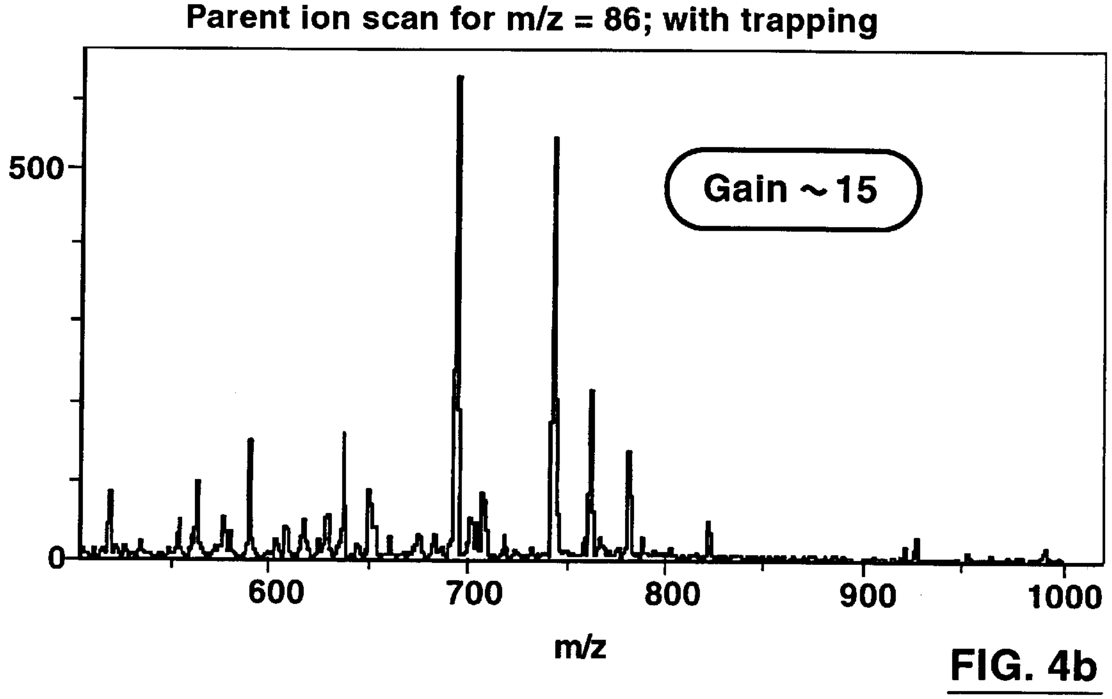
Figure 5A:
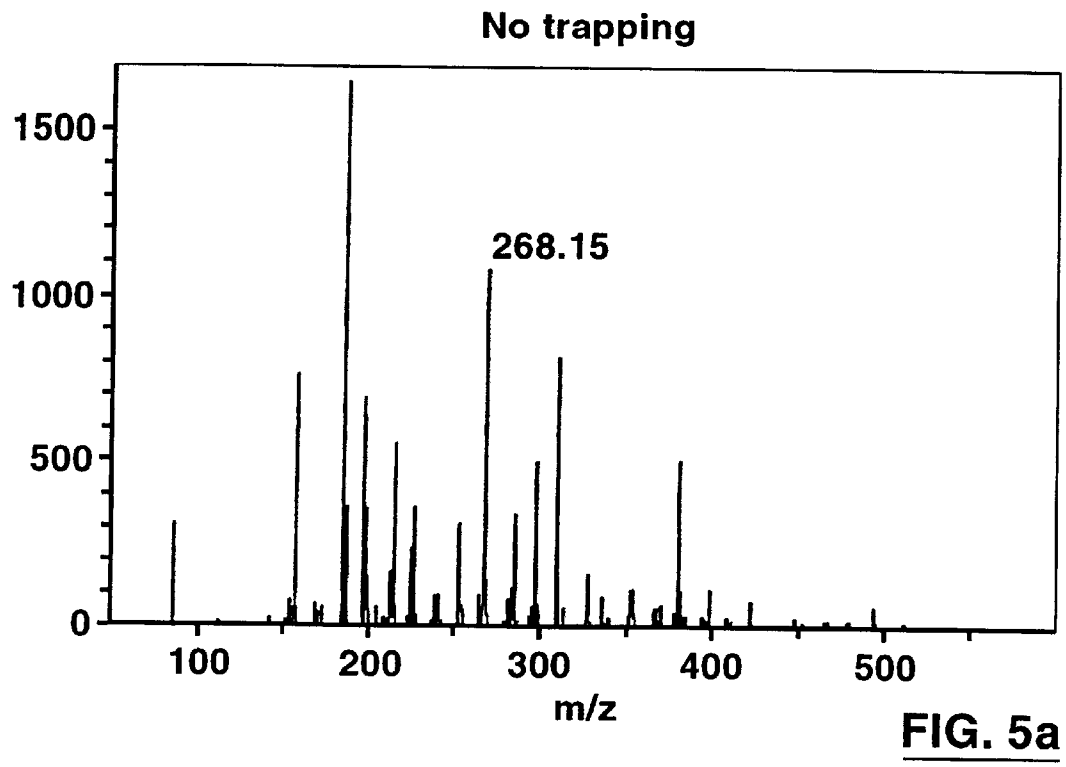
Figure 5B:
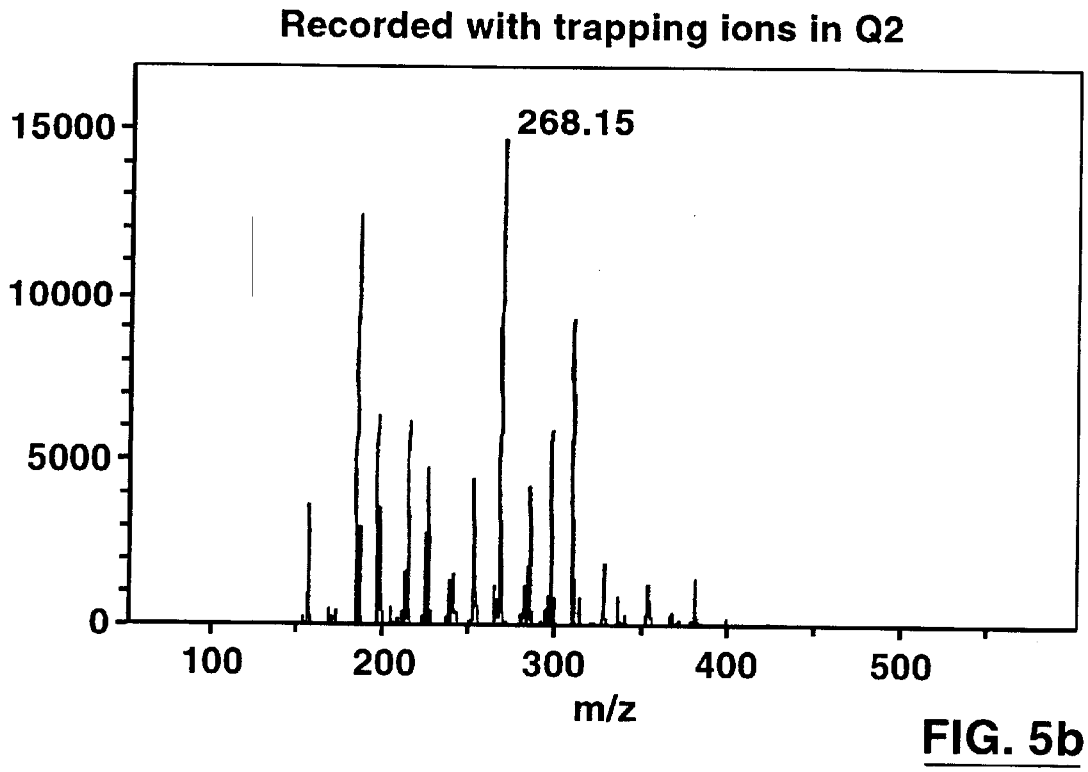

FIGS. 3*a*–3*d* are graphs showing variation of sensitivity for different pulse delays for ejecting ions from an ion trap and showing comparison with no trapping;

FIGS. 4*a* and 4*b* are graphs showing the relative performance for a parent ion scan, with and without ion trapping;

FIGS. 5*a* and 5*b* are graphs showing the relative performance for an MRM scan, with and without ion trapping; and FIGS. 6*a*–6*d* are graphs showing variation of the flight time for different gate voltage profiles on the exit lens from the collision cell, with gate voltage profiles shown insert.

DESCRIPTION OF THE PREFERRED EMBODIMENT

Referring first to FIG. 1, there is shown a QqTOF instrument, and the basic configuration of such an instrument is known.

This instruments includes an electrospray source 10, although it is understood that any suitable ion source can be provided. Ions pass through into a differentially pumped region 12, maintained at a pressure of around 2.5 torr, and from there through a skimmer 14 into a first collimating quadrupole Q0 operated in RF-only mode. Q0 is located in a chamber 16 maintained at a pressure around $10^{-2}$ torr.

Downstream, there is a further chamber 18, containing two main rod sets Q1 and Q2, with Q2 being located within an interior, subsidiary chamber 20. Chamber 18 would be maintained at a low pressure of approximately $10^{-5}$ torr, while the subsidiary chamber 20 is supplied with nitrogen or argon gas as indicated at 21 for effecting CID. Chamber 20 would be typically maintained at a pressure of around $10^{-2}$ torr.

Upstream from the rod set Q1 is a short collimating rod set 22. The rod set Q1 is operated in a mass resolving mode, to select ions with a particular m/z ratio. These ions then pass through into Q2 and are subject to collision-induced dissociation (CID). Then, the fragment ions, and any remaining parent ions pass through into the TOF instrument indicated generally at 30.

It is to be noted that the various chambers of the device are, in known manner, connected to suitable pumps, with pump connections being indicated at 24, 25, 26 and, for the TOF instrument at 32. Commonly, the differentially pumped region 12 would be connected to a roughing pump, which would serve to back up higher performance pumps connected to the pump connections 25, 26 and 32.

As the ions leave the chamber 20, they pass through a focusing grid 27 and then pass through a slit having dimensions of 2 mm times 8 mm into the TOF 30.

Within the TOF 30, there is an ion storage zone 34 and window 35. Grids 36 are provided in known manner for effecting a push-pull pulse to ions collected in the ion storage zone 34. An accelerating column is indicated at 38.

At the far end of the TOF instrument, there is an ion mirror 40 and a detector is provided at 42. In known manner, the main chamber or flight tube of the TOF is defined by a liner 44.

Ions leaving the ion storage window 34 are accelerated towards the ion mirror 40 and then back towards the detector 42. The ions still have a transverse velocity (resulting from their travel through the quadrupole rod sets Q0, Q1 and Q2), which means that they return to the detector 42. Clouds of ions are indicated schematically at 46, showing how ions travel through the TOF instrument 40.

Now, in accordance with the present invention, the chamber 20 around the quadrupole Q2 is provided with lenses 50 and 51 at either end so that it can be operated as an ion trap.

Reference will now be made to FIGS. 2*a,* 2*b* and 2*c* to explain the effect of trapping ions in Q2 on the instrument's duty cycle. FIG. 2*a* shows Q2, the chamber 20 and the lenses 50, 51, the grid 27, the slit 28 and the ion storage zone 34 with a window 35. FIG. 2*b* shows the plot of voltage along the axis of Q2 (is it worth showing?), and FIG. 2*c* shows the timing of the voltages applied to the lens 51 and storage zone 34.

FIG. 2*b* shows the variation of the DC potential along the axis of the rod set Q2. The DC potential at the rod set Q2 is indicated at 60, and at 61 the potential gradients at either end up to the potential of lenses 50, 51 are indicated. The potential at the slit is indicated at 62 (in our case, the slit and the storage zone 34 are at ground potential). Line 63 (top line) shows the profile of the potential when ions are trapped in Q2, and Line 64 shows the profile of the potential when the voltage on exit lens 51 is dropped in order to release a pulse of ions. The exact form of this gradient can be modified by changing the potential on grid 27, which is between lens 51 and slit 28. Thus, in effect, through the chamber 20, the ions then see either a constant DC potential, or a gradient accelerating the ions towards the storage region 34.

In FIG. 2*c,* 70 shows the variation of potential on the exit lens 51 with time. For comparison purposes, for the lens 51, the dashed line 76 indicates the DC potential of the rod set Q2 correspondingly. Line 74 shows the variation of potential of the conventional push-pull arrangement at the ion collection zone 34.

During the trapping period (lens 51 at "high" voltage, typically 2V above the potential 76 of the rod set Q2), ions enter collision cell Q2 easily, but cannot leave it in either axial direction because of the potential barrier present on both entrance and exit lenses 50 and 51. This is true even if ions have a significant amount of energy upon entering Q2, since most of this energy will be lost due to collisions with gas in Q2, resulting in both fragmentation and collisional damping of ions.

When it is desired to eject a pulse of ions, the voltage on the lens 51 is switched to "low", (as shown at 64 in FIG. 2*b*) which is lower than the potential of the rod set 76. This "low" voltage is applied for the time ΔTp. Typically, the "high" voltage is a few volts higher, and the "low" voltage is a few volts lower that the rod set voltage 76.

A cloud of ions then leaves the ion trap. After time ΔTp when some, but not necessarily all of the ions have left the ion trap, the voltage on the lens 51 goes to "high" again. The time between pulses (typically 100–200 μs) is much smaller than a characteristic time of scanning Q1 (dwell time), typically 1–10 ms, so it is not critical if some ions remain in the trap of Q2, as these can be included in the next pulse. This has a dual effect: it starts trapping in Q2 again; and it may also have the effect of accelerating the rearmost portion of the elongated ion cloud towards the TOF device and causing the ions to bunch up. This is a desirable effect, as it helps to produce a shorter (in the direction of flight) ion cloud. While trapping itself doesn't depend on the particular values of "high" and "low" voltages, the "bunching" effect depends strongly on these voltages, and they should be adjusted properly; this is detailed below. Generally, $\Delta Tp$ is calculated from the velocity of ions of interest and the length of the storage zone 34, so that the cloud of ions is short enough not to overfill the storage zone 34, so as to make best use of the ions.

The ion cloud then passes through the slit 28 and into the ion storage zone 34. After a time delay period $t_D$, as indicated in FIG. 7, the appropriate push-pull voltages, indicated at 74, are applied, to accelerate the ions into the TOF device, for measurement in known manner.

The time delay $T_D$ is selected in such a way so as to maximize transmission of ions in the m/z-range of interest. Since all ions are accelerated with same electric fields from lens 51 to the storage zone 34, they obtain same kinetic energy in this region, but their velocity depends on their mass. Thus, this region serves as another small TOF analyzer where a rather crude separation of ions happens.

The ion transmission is maximized for those ions which at the time of push-pull pulse happen to be in the storage zone 34 exactly under the window 35. For those ions a 100% duty cycle will be achieved. So, the optimal delay time $T_D$ is selected to allow ions of interest to move from Q2 to the storage zone 34 and generally centered under the window 35.

The delay time $T_D$ is proportional to $\sqrt{m/z}$. Since the flight time through the main TOF device is also proportional to the same value, the optimal delay time can be found as a certain ratio of the flight time measured in the TOF device. In our instrument, these times were found to be roughly equal.

Now, for m/z=86, the flight time through the TOF device is 26 $\mu$s, while the optimal delay time $T_D$ was found to be 22 $\mu$s, i.e. approximately equal as indicated. This ion, with m/z=86, is of particular interest in some applications since it is an immonium ion of most abundant amino acid residues leucine and isoleucine, and it is widely used in "parent ion scanning" in order to distinguish peptide ions from ions of other compounds.

Based on the dimensions of the instrument used, the average time for the ions to travel from the ion trap to the ion collection zone 34 is 17.5 $\mu$s. For this the calculated pulse width $\Delta Tp$ should be approximately 6.5 $\mu$s. The fact that the actual optimum values found (20 $\mu$s pulse width and 22 $\mu$s time delay) for m/z 86 are different from the calculated values, may be due to the additional time which is required for ions to travel from inside the collision cell to the exit lens 51.

It is to be appreciated that the invention can also be used to effect a neutral loss scan. In such a scan, the intention is to measure ions having a constant mass difference from ions selected in Q1, with the same charge. For example, if ions with an m/z of 1,000 are selected in Q1, then the TOF 31 could look for ions with an m/z of 800; in other words, one is looking for a neutral mass loss of 200 daltons with both ions being singly charged. A neutral loss scan for 200 would require scanning the quadrupole, while trapping in the collision cell and adjusting the time delay to provide optimum efficiency for fragment ions which were 200 daltons lower in m/z than the parent ion.

Figure 3A:
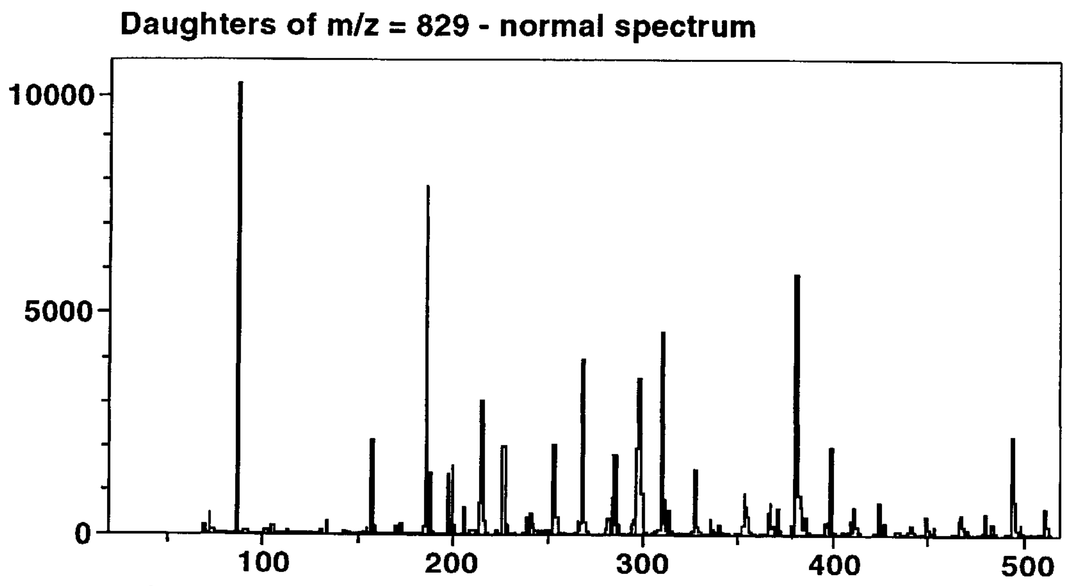
Figure 3B:
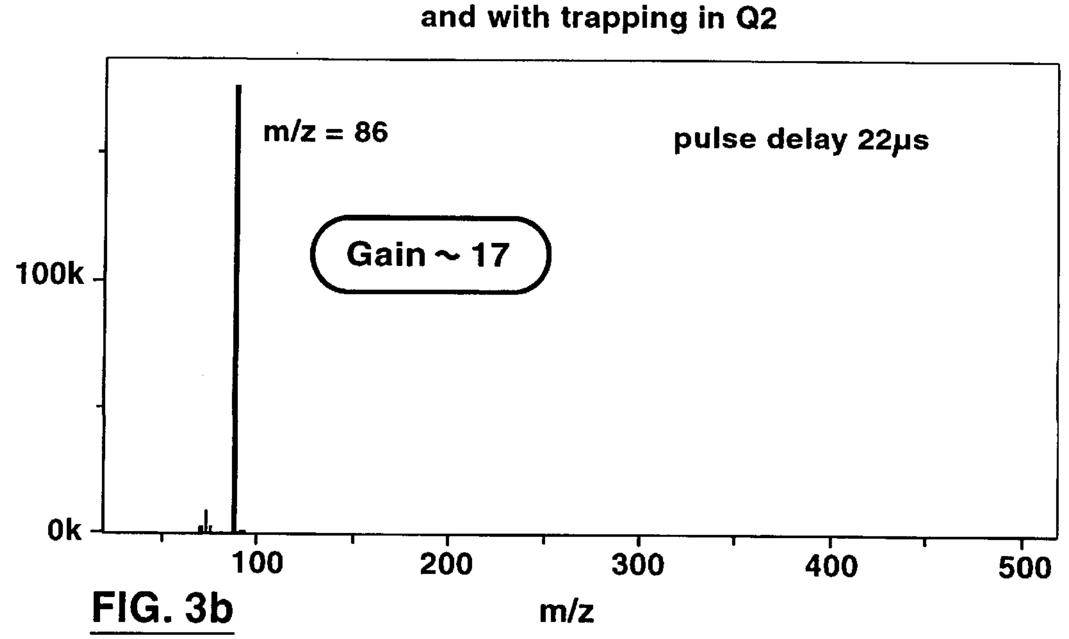

Reference will now be made to FIGS. 3*a* and 3*b*, which show a series of tests carried out using a peptide, commonly identified as ALILTLVS, to generate the ions. This peptide has an m/z of 829. It was passed into Q2, trapped and fragmented, and the fragment ions scanned in the TOF instrument or device 30. FIGS. 3*a* and 3*b* show two variants of this test; in FIG. 3*a* no trapping was carried out, and the fragment ions were passed straight through to the TOF instrument 30, and in FIG. 3*b*, trapping was carried out with a time delay $T_D$22 $\mu$s.

As shown in FIG. 3*a*, the total count for the m/z 86 was around 10,000, and there was a significant signal detected in the range of approximately m/z 200–500. In FIG. 3*b*, on the other hand, the count for m/z 86 shows a gain of approximately 17. Noticeably, the signal for ions of higher m/z is largely absent. This is due to the coarse or rough mass selection which occurs when ions are released from the ion trap to the ion collection window 34.

Figure 3C:
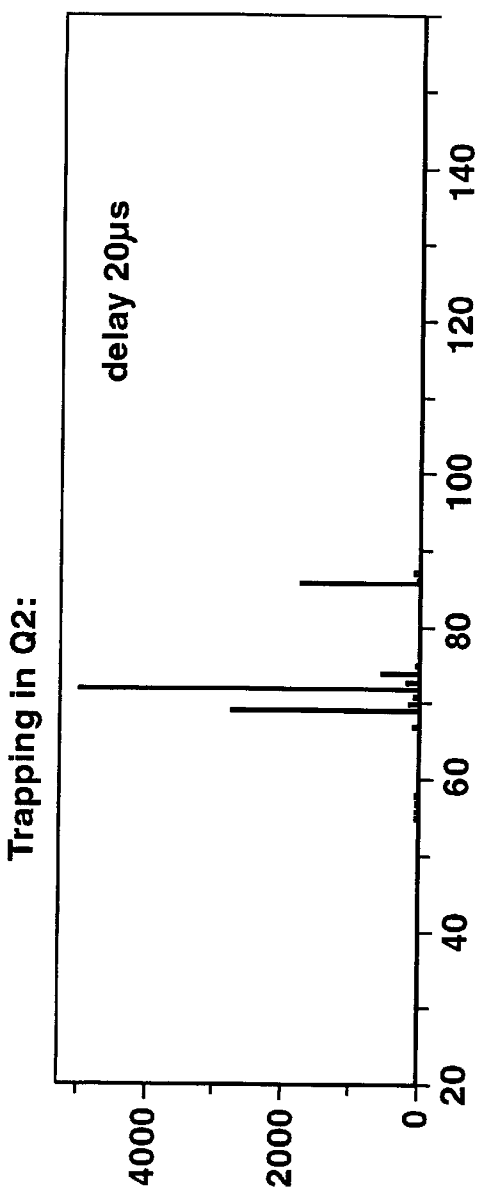
Figure 3D:
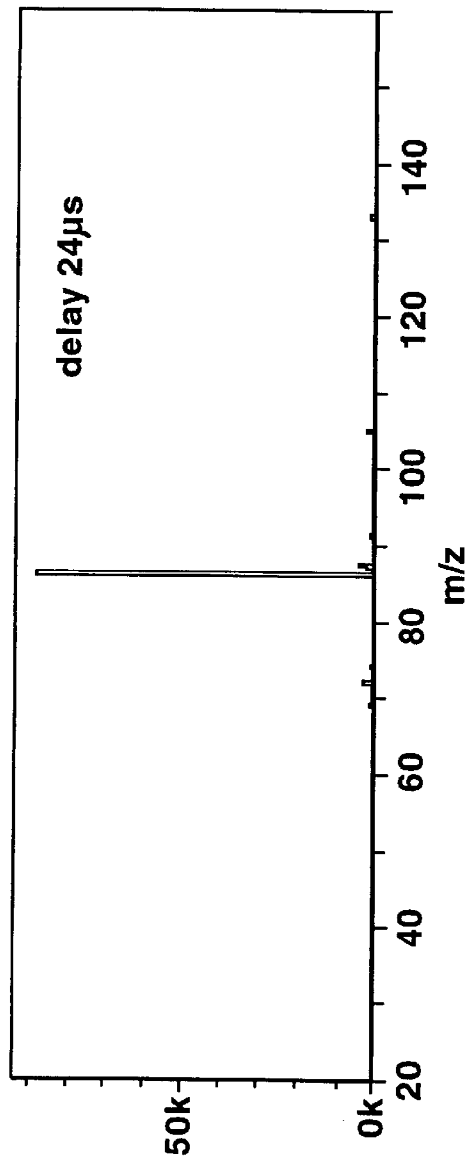

This is emphasized further in FIGS. 3*c* and 3*d*. These two figures show respective delays of 20 and 24 $\mu$s. As might be expected, the shorter delay of $T_D$=20 $\mu$s, is not quite long enough for ions of m/z=86 to reach the ion collection zone 34. In fact, this shows a reduced signal even as compared to the untrapped signal of FIG. 3*a*. Relatively high counts are recorded in the range 60–80 m/s.

In contrast, in FIG. 3*d*, a relatively strong signal is recorded, for $T_D$=24 $\mu$s, but the performance is not as good as in FIG. 3*b*. This series of figures clearly indicates that selection of the appropriate time delay $T_D$ is critical to obtaining high sensitivity and a strong signal for the mass of interest.

Turning now to FIGS. 4*a* and 4*b*, these show a parent ion scan for a tryptic digest of myoglobin, i.e. myoglobin digested by an enzyme to give a variety of peptides. Here, the vertical axis again indicates the number of counts for m/z 86 as detected in the TOF instrument 30. The horizontal axis shows the variation of m/z of the parent ion, as scanned in Q1.

Thus, FIG. 4*a* shows two significant peaks for an m/z of the parent ion of somewhere just below 700 and at approximately 740, as giving strong signals for m/z 86 detected in the TOF instrument 30.

A comparison of FIG. 4*b* shows an approximate gain of 15 in the signal strength for the peaks detected, when trapping is carried out in Q2. Again, trapping here is carried out with the delay $T_D$ determined from the results shown in FIG. 3, i.e. with $T_D$=22 $\mu$s. One can also note that relative diminution of small, background peaks in FIG. 4*b* as compared to FIG. 5*a*.

Turning to FIGS. 5*a* and 5*b*, these again show a comparison of results obtained without trapping and with trapping. Once again, the sample used was the peptide ALILTVS, which produces a precursor ion of m/z 829. The precursor m/z 829 was selected with Q1 and fragmented in the collision cell, and FIG. 5*a* shows the full MS/MS spectrum, which contains an ion of m/z 268.15. While it is prominent, it is not the highest peak, and it shows an intensity of approximately 1,100. This shows the effect of no trapping.

With trapping, and optimizing the time delay for m/z 268.15, one can see that this peak at m/z 268.15 is now the largest peak, and the total count has increased, by a factor of 13 to approximately 15,000. This indicates that the method can be used to optimize ions of different m/z.

The trapping method can be used advantageously to improve the performance of the MRM mode of analysis. The MRM mode is commonly used on triple quadrupoles to quantitatively measure the levels or amounts of targeted compounds, where the precursor and fragment ions are known. In triple quadrupoles, Q1 and Q3 are sequentially tuned to one or more parent/fragment ion combinations. On the QqTOF, the trapping method can be used to improve the sensitivity for the targeted ions of interest, by setting Q1 to the precursor ion of interest and the time delay appropriate to the fragment ion of interest. After recording the ion intensity in the TOF for the fragment ion of interest for a time period of a few milliseconds, then Q1 and the time delay can be set to new values appropriate for another parent/fragment combination. This provides enhanced sensitivity for the MRM mode, where several targeted ions can be monitored.

Referring now to FIGS. 6*a*–6*d*, these show the effect of variation in the voltages on the exit lens 51 and the duration ΔTp, of the voltage pulse on that exit lens. For convenience, each of these figures include some insert, indicating the voltage pulse profile, with references 70, 70A and 76, as in FIG. 2*c*.

For the data collected at FIGS. 6*a*–6*d*, the peptide ALILTLVS is used. It is fragmented upstream of Q0, by a separate technique. In Q1, m/z 86 was selected. Q2 was operated in a trapping mode only with no fragmentation. The TOF instrument 30 was operated in a DC mode, i.e. with no pulsing, so that the total flight time from Q2 to the TOF detector could be determined. Thus, the flight times shown in FIG. 6 are a total of the flight times from the lens 51 to the ion storage zone 34, and then from the ion storage zone 34 to the detector 42.

Figure 6A:
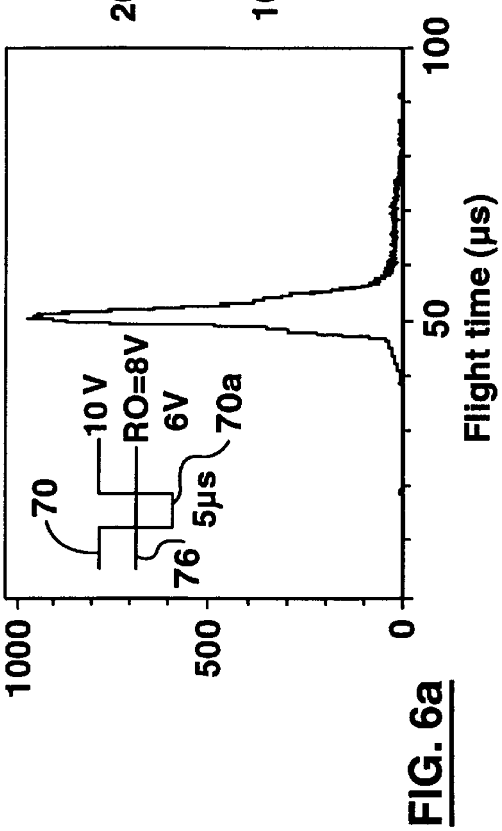

Referring first to FIG. 6*a*, this shows that the voltage on lens 51 was initially 10 volts, that is 2 volts above the DC rod potential of 76. For a pulse period of 5 μs, as indicated at 70A, this voltage is reduced to 6 volts. This gave the peak profile shown.

Figure 6B:
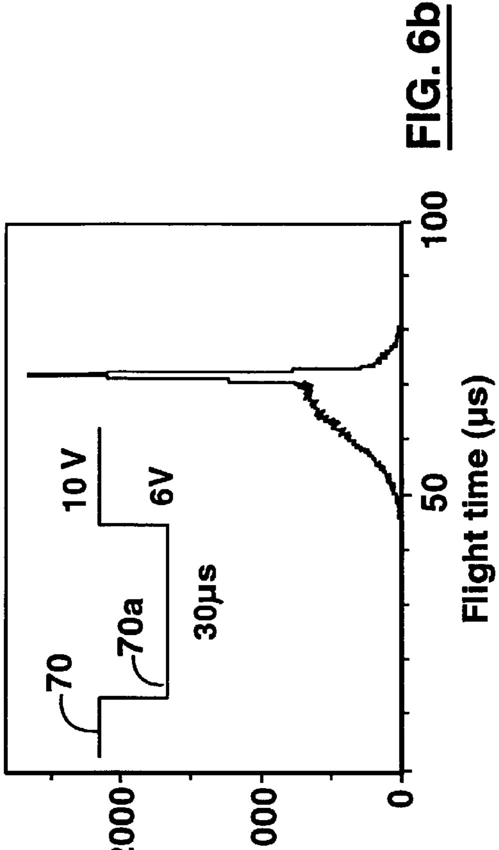

FIG. 6*b* shows a pulse with similar high and low voltage characteristics, but with a much longer duration of 30 μs. As might be expected, this shows a considerable width to the base of the peak. This indicates that there is an initial burst of ions leaving the rod set Q2, and then remaining ions are released more slowly.

Figure 6C:
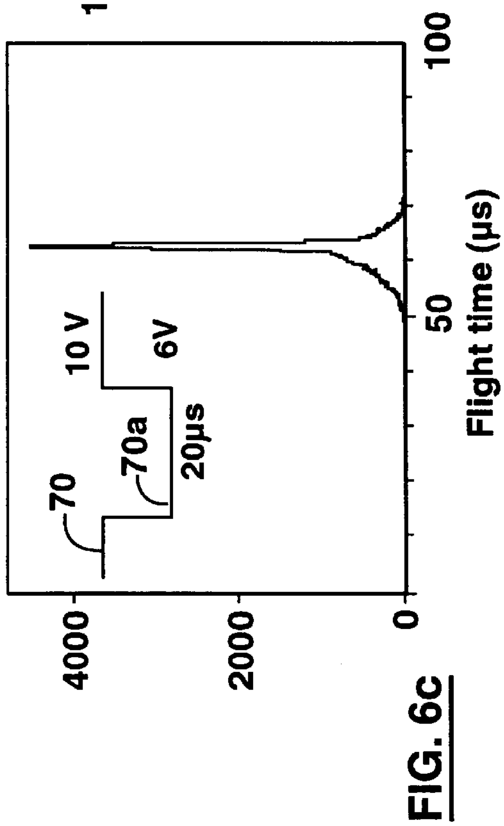

FIG. 6*c* shows the same voltage characteristics, but for an intermediate duration ΔTp of 20 μs. This shows a much improved peak shape. The peak shows a higher maximum, and less spreading.

Figure 6D:
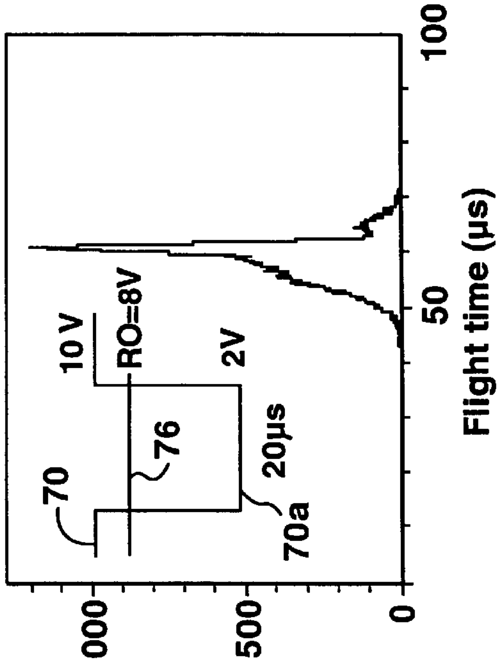

FIG. 6*d* shows an alternative pulse profile, for comparison purposes. Here, the duration ΔTp again was 20 μs, but when the gate 51 was opened, its voltage was reduced to 2 volts, i.e. 6 volts below the DC potential of the rod set Q2. It is believed that this large drop, and then the recovery at the end when the lens 51 is switched back to 10 volts, gave an undesirably large acceleration to those ions which left the collision cell last. As a consequence, these ions, effectively, arrived early, giving the expanded peak width on the left-hand side, showing ions arriving shortly after 50 μs. It seems clear that the time focusing properties exhibited in FIGS. 6*a*–6*d* are due to the process known as time-lag focusing.

It is clear from FIG. 6 that appropriate selection of the voltage magnitude and the pulse duration ΔTp can be helpful in obtaining a sharp peak shape, which can improve the definition of the mass window and provide better sensitivity.

What is claimed is:

1. A method of effecting mass analysis on an ion stream, the method comprising:

(1) passing the ion stream through a first mass resolving spectrometer, to select parent ions having a first desired mass-to-charge ratio;

(2) subjecting the parent ions to collision-induced dissociation to generate fragment ions;

(3) trapping the fragment ions and any remaining parent ions;

(4) periodically releasing pulses of the trapped ions into a time of flight instrument to detect ions with a second mass-to-charge ratio; and (5) providing a delay between the release of the pulses of trapped ions and initiation of push-pull pulses in the time of flight instrument, and adjusting the delay to improve the duty cycle efficiency of ions with the second mass-to-charge ratio.

2. A method as claimed in claim 1, which includes in step (1) sequentially scanning over a range of masses, to effect a parent ion scan.

3. A method as claimed in claim 1, which includes scanning the first and second mass-to-charge ratios over desired ranges to maintain a substantially constant neutral mass loss between the first and second mass-to-charge ratios, whereby a neutral loss scan is effected, and simultaneously adjusting the delay as the second desired mass-to-charge ratio is scanned over the desired range.

4. A method as claimed in claim 1, which includes the following additional steps:

sequentially setting the first mass resolving spectrometer to select non-contiguous parent ions with selected parent mass-to charge ratios;

for each selected parent mass-to charge ratio, adjusting the delay for detection of a corresponding fragment ion;

whereby the TOF spectra indicate the presence of each fragment ion generated from the corresponding parent ion, to effect a multiple reaction monitoring (MRM) scan.

5. A method as claimed in claim 1, which includes releasing the pulses of trapped ions during a pulse period and adjusting the width of the pulse period, to improve the duty cycle efficiency for ions with the second mass-to-charge ratio.

6. A method as claimed in claim 5, which includes adjusting the pulse period and the delay between the release of the pulses and initiation of the push-pull pulses in the time of flight instrument, to improve the duty cycle for a range of ion mass values, which includes said second mass-to-charge ratio.

* * * * *